United States Patent
Artieri

(10) Patent No.: US 8,913,356 B2
(45) Date of Patent: Dec. 16, 2014

(54) COMPOSITE ELECTRONIC CIRCUIT ASSEMBLY

(75) Inventor: Alain Artieri, Saint-martin-d'heres (FR)

(73) Assignee: ST-Ericsson SA, Plan-les-Ouates (CH)

( * ) Notice: Subject to any disclaimer, the term of this patent is extended or adjusted under 35 U.S.C. 154(b) by 509 days.

(21) Appl. No.: 13/266,180

(22) PCT Filed: Apr. 20, 2010

(86) PCT No.: PCT/EP2010/055181
§ 371 (c)(1),
(2), (4) Date: Oct. 25, 2011

(87) PCT Pub. No.: WO2010/124967
PCT Pub. Date: Nov. 4, 2010

(65) Prior Publication Data
US 2012/0039004 A1   Feb. 16, 2012

(30) Foreign Application Priority Data
Apr. 29, 2009  (FR) ..................................... 09 52808

(51) Int. Cl.
*H02H 9/00* (2006.01)
*H01L 25/18* (2006.01)
*H01L 23/50* (2006.01)

(52) U.S. Cl.
CPC ....... *H01L 23/50* (2013.01); *H01L 2225/06517* (2013.01); *H01L 25/18* (2013.01); *H01L 2224/13025* (2013.01); *H01L 2224/16227* (2013.01); *H01L 2225/06513* (2013.01); *H01L 2224/16225* (2013.01); *H01L 2224/16145* (2013.01); *H01L 2924/15311* (2013.01)
USPC .......................................................... 361/56

(58) Field of Classification Search
CPC .............................. H01L 27/0248; H02H 9/04
USPC .......................................................... 361/56
See application file for complete search history.

(56) References Cited

U.S. PATENT DOCUMENTS

| | | | |
|---|---|---|---|
| 6,396,137 B1 | 5/2002 | Klughart | |
| 7,085,143 B1 | 8/2006 | Dyckman et al. | |
| 2006/0065962 A1* | 3/2006 | Narendra et al. | ............. 257/686 |
| 2007/0007642 A1 | 1/2007 | Tajika | |

FOREIGN PATENT DOCUMENTS

| | | | |
|---|---|---|---|
| WO | 00/28590 A1 | 5/2000 | |
| WO | 00/41242 A1 | 7/2000 | |

OTHER PUBLICATIONS

International Search Report issued in corresponding International Application No. PCT/EP2010/055181, mailing date Jul. 16, 2010.
Written Opinion of the International Searching Authority issued in corresponding International Application No. PCT/EP2010/055181, mailing date Jul. 16, 2010.

* cited by examiner

*Primary Examiner* — Dharti Patel
(74) *Attorney, Agent, or Firm* — Patent Portfolio Builders PLLC

(57) ABSTRACT

A composite electronic circuit assembly comprises two MOS or CMOS circuit dice (100, 200) superimposed inside a package. Different modules of the circuit assembly are distributed between the two dice based on the digital, analog, or hybrid nature of said modules. Such a distribution makes it possible to group together the digital modules of the circuit assembly in one of the die and the analog or hybrid modules in the other die. The production cost, development time, and electrical energy consumption of the circuit assembly may thus be reduced.

20 Claims, 4 Drawing Sheets

COMPOSITE ELECTRONIC CIRCUIT ASSEMBLY

This invention relates to a composite electronic circuit assembly.

Integrated electronic circuits, in the form of integrated circuit dice, are now present in a great number of everyday appliances. This is particularly the case with mobile telephones. It is therefore necessary to produce such electronic circuits at increasingly lower costs, with increasingly better performance and also increasingly shorter design and development times.

Yet the cost price of an integrated electronic circuit depends to a significant degree on the size of the portion of silicon substrate occupied by the integrated circuit die. For this reason, increasing the integration level of electronic circuits has been a priority for professionals in the field for some twenty years. This integration level is defined by the minimum dimension of the lithographic pattern that can be produced on an integrated circuit production line. This minimum dimension is also called the lithographic linewidth or simply integrated circuit technology. This linewidth determines in particular the maximum number of transistors that can be fabricated per unit area of the die. For example, generations of integrated electronic circuits that have appeared successively have lithographic linewidths equal to 65 nm (nanometers), 55 nm, 45 nm, and then 32 nm and 28 nm. There are also plans in the near future to produce integrated electronic circuits with linewidths of 22 nm, then 20 nm and 16 nm.

The well known advantages of a smaller lithographic linewidth include less electrical power used in the die when the circuit is operating and faster circuit operating speeds.

But adopting a new integrated electronic circuit technology with a lithographic linewidth smaller than that of the prior technology raises many problems, including the following:

The acquisition cost for a new integrated circuit production plant that uses new smaller lithographic linewidth technology is considerable. Yet, its use causes a reduction in production for existing production plants that have a larger lithographic linewidth, although the latter are still available. The result is thus an overall loss of use of all production tools.

The electrical energy consumed when an integrated electronic circuit die is operating includes an amount of electrical energy which is lost, in addition to the amount of energy which is useful to perform the function for which the circuit is used. The amount of electrical energy lost is mainly caused by undesired leakage currents that flow between certain components of the electronic circuit and the bulk of the die substrate. That bulk of the substrate is generally connected to an electrical ground terminal of the circuit. Indeed, the different electrical insulation layers or portions that enter into the composition of the electronic circuit components become smaller as the lithographic linewidth shrinks and their insulating efficiency decreases commensurately. Leakage currents then occur to flow through these insulating layers or portions. They not only attenuate useful signals, but they also cause energy losses. And such energy losses can greatly reduce the operating time of a device that has such an integrated electronic circuit when the device is battery-powered. This is the case with mobile telephone devices and portable electronic terminals and consoles; and The design and development time for an integrated electronic circuit die is longer when it uses a new technology with a lithographic linewidth smaller than that of the prior technology. In particular, the design and development time is longer for analog or hybrid digital/analog circuit modules, compared with purely digital circuit modules. The result is that the development time for a circuit die that is fabricated with a new technology is longer, mainly because of the analog or hybrid digital/analog modules contained in that die. In particular, development of signal input/output ports may considerably increase the total circuit die development time.

Furthermore, it is known to place several integrated circuit dice within a single integrated circuit package which is common to these dice. Combining dice in this manner within a single package takes up less total space in the device where they are located. Taking up less space is particularly advantageous when the device is intended for mobile use, such as mobile telephone devices. In addition, sharing an integrated circuit package for several dice contributes to reducing the overall cost of the circuit.

Several arrangements have been used to date for placing several die inside a single package. They differ in particular by the type of electrical connections that are used to electrically connect the dice to one another and each die to external terminals located on the package. In one commonly used arrangement, the dice are superimposed in the package and two of the dice are placed opposite one another in a so-called flip-chip configuration. In that configuration, the two dice are placed in parallel, with their similar faces turned toward one another. The "face" of an integrated electronic circuit die is understood to mean either the face formed by its substrate, on the side opposite the transistors, or the face formed by the last metallization level superimposed on top of and starting at the substrate, with one or more upper protective layers. In a flip-chip configuration, the two dice may be assembled with bump microsoldering or pillar bumps of an appropriate metal such as copper connecting the electrical terminals located facing one another on the two dice. The length of the electrical connections between the two dice is thus minimized, which reduces interference that may cause stray radiation between the two dice. Furthermore, such a configuration makes it possible to have a larger number of connections between the two dice, in a matrix arrangement of connections. All connections are then produced simultaneously, with the duration of the manufacturing sequence spent on those connections being short.

Under these conditions, an object of the present invention is to propose a new integrated electronic circuit architecture that allows easier and more economically viable transitions between successive circuit fabrication technologies.

In particular, an object of the invention is to optimize the simultaneous use of integrated circuit production plants corresponding to different levels of integration.

Another object of the invention consists in reducing the total design and development time for an integrated electronic circuit when two technologies are simultaneously available.

Still another object of the invention is to reduce the portion of the electricity consumption of an integrated electronic circuit that is lost due to leakage currents.

In general, an object of the invention is to provide an optimized compromise for the design and fabrication of an integrated electronic circuit, particularly as regards the aforesaid challenges and others as well.

To this purpose, the invention proposes a composite electronic circuit assembly that comprises two integrated circuit dice of the MOS (Metal Oxide Semiconductor) or CMOS (Complementary MOS) type and an integrated circuit package, with the two circuit dice placed in parallel to one another inside the package and electrically connected to one another by intermediate connection elements.

A first characteristic of the invention resides in the distribution between the two dice of different circuit modules that constitute all together the electronic circuit. In this distribution, one of the two circuit dice, so-called digital die and designated by DIGIC for "DIGital Integrated Circuit," contains circuit modules with digital functions, including combinatorial and/or sequential logical operators, ROM (Read Only Memory), and/or SRAM (Static Random Access Memory).

The other circuit die, so-called hybrid die and designated by MSIC for Mixed Signal Integrated Circuit, contains all circuit modules with analog functions or hybrid analog-digital functions. The hybrid MSIC die may also contain certain modules with digital functions, when this results in the overall optimization of the circuit assembly. Thus, the hybrid die specifically contains at least some of the following modules:

Switching Mode Power Supply modules, designated by SMPS,
linear power supply modules, designated by LDO for Low Drop Out power supply,
switch modules, designated by EPOD for Embedded POwer Distribution,
write-once memory modules, designated by OTP for One-Time Programmable memory,
phase locked clock generation modules, designated by PLL for Phase Locked Loop timers,
Analog-to-Digital Converters, designated by ADC, and Digital-to-Analog Converters, designated by DAC,
electrical signal Input-Output modules, designated by 10,
PHYsical interface modules, designated by PHY, and/or
Random Number Generator modules, designated by RNG.

Thus, all the circuit modules are distributed between the two dice based on their nature: the digital die contains only digital modules, while all analog or combination digital/analog modules are grouped together in the hybrid die. The digital die can then be quickly developed and perfected with a technology that corresponds to a higher level of integration, while the hybrid die can be produced using a technology which is better mastered. Specifically, the digital die may have a lithographic linewidth that is smaller than that of the hybrid die. The total design and development time for the circuit assembly may thus be shortened, allowing it to move more quickly from design to market.

Furthermore, dividing the circuit assembly into two dice allows them to be produced separately and at the same time on different integrated circuit production plants. In particular, the digital die may be produced on a line whose technology is more advanced than the hybrid die production line.

According to a second characteristic of the invention, each digital module that is contained in the digital die is connected so that it is powered by at least one of the power supply modules contained in the hybrid die, based on digital signals that are representative of a difference between an actual voltage of the digital module and a target supply voltage for that digital module. These digital signals are produced by at least one power supply monitoring module contained in the digital die, and are transmitted to a power, reset, and clock management unit contained in the circuit assembly. The power supply monitoring module is hereinafter designated PMB for Performance Monitoring Box and the power, reset, and clock management unit is designated PRCMU for Power, Reset & Clock Management Unit.

According to a third characteristic of the invention, the power, reset, and clock management unit is arranged so as to remain active when the electronic circuit assembly is in idle state. For this purpose, the PRCMU unit controls those modules that remain permanently activated during the idle state, and they are consequently continuously supplied with electrical power for the entire duration of the idle state. It also controls the power supply for those modules whose operation is stopped during the idle state. It may also control triggering the automatic idle state for the circuit assembly, as well as triggering leaving the idle state. Although it has a purely digital function, and because the PRCMU unit is always active, occupies a fairly small area of the substrate, and has a fairly low operating frequency, it may advantageously be integrated into the hybrid MSIC die in order to reduce the leakage currents.

Furthermore, the architecture of the circuit assembly according to the invention makes it possible to optimally manage its electrical power consumption. Indeed, the power supplied to each digital module is adjusted to ensure that the module has a supply voltage that matches the target value, particularly thanks to the PMB and PRCMU modules. Furthermore, analog or hybrid digital/analog modules may be produced with a larger lithographic linewidth than digital modules, so that their leakage currents are limited.

In particular embodiments of the invention, the linewidth of the lithographic pattern of the hybrid MSIC die may be 65 nm and the linewidth of the lithographic pattern of the digital DIGIC die may be either 45 nm, 40 nm, 32 nm, 28 nm, 22 nm, 20 nm, or 16 nm.

Other features and advantages of the present invention will become apparent from the following description of non-limiting exemplary embodiments, with reference to the attached drawings, wherein.

Figure 1:
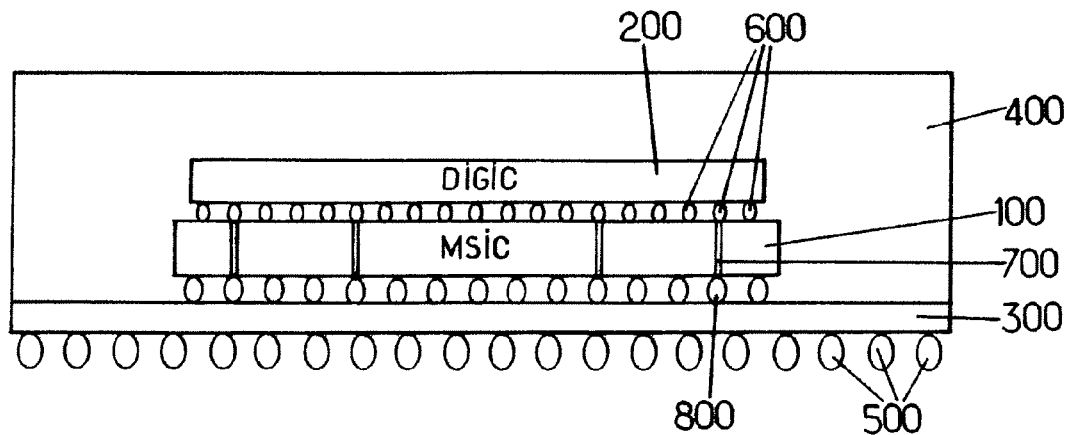
FIG. 1 is a schematic cross-section of an electronic circuit assembly according to the invention.

As shown in FIG. 1, an integrated electronic circuit assembly according to the invention comprises two circuit dice that are respectively designated 100 and 200. Die 100 is the hybrid die, or MSIC, and die 200 is the digital die, or DIGIC. Most often, the two circuit dice participate in the same global function of the circuit assembly, performed during its use. They each execute complementary functions in order to achieve this global function. Alternatively, the two dice may perform independent functions, while sharing common modules, such as power supply modules, input/output modules, etc.

The two dice 100 and 200 are contained in a common circuit package, which is composed of a base part 300 and a cover part 400. They are placed in the package parallel to the base part 300, one above the other. For example, the hybrid die 100 may be located between the digital die 200 and the base part 300. However, an arrangement which reverses the positions of the dice 100 and 200 within the package is also possible. The circuit package may be a model known prior to the invention. In particular, it may comprise external connection terminals 500 and internal connection terminals 800. The terminals 500 and 800 are connected by conductor elements passing through the base part 300, in order to electrically connect the two dice 100 and 200 to components external to the package.

The internal connection elements 800 that electrically connect the hybrid die 100 to the conductor elements that pass through the base part 300 may be of any of the types known to a person skilled in the art, such as wire bonding or bumping microsoldering, with a pitch between 40 and 100 μm (micrometers). Furthermore, the two dice 100 and 200 are electrically connected to one another by a set of intermediate connection elements 600.

The digital die 200 may be oriented face-to-face with the hybrid die 100, whose substrate part is itself turned toward the base part 300. "Dice oriented face-to-face", or a flip-chip arrangement, is understood to mean that the respective faces of the two dice facing one another are the upper faces, composed of the last metallization levels of the two dice. It is understood that the last metallization level of each die may be covered with one or more protective layers in a manner that is also known. In the case of a flip-chip arrangement, the intermediate connection elements 600 may also be of a known type, particularly bump microsoldering or copper pillars. In that case, a first manner of electrically connecting the two dice to the rest of the package is to use via conductors 700 that pass through the substrate part of the hybrid die 100 and electrically connect the two dice 100 and 200 to the internal connection terminals 800. Another manner is to connect the hybrid die 100 to the base part 300 by wire bonding to the conventional inputs/outputs of the hybrid die 100, which are placed on the edge of the latter. In that case, the hybrid die 100 must be larger than the digital die 200. Other methods are also possible for connecting the two dice to the base part 300.

On the other hand, the two dice 100 and 200 may be oriented in the same direction within the package, with their respective upper faces turned toward the base part 300. In that case, the via conductors 700 that pass through the substrate part of the hybrid die 100 electrically connect the digital die 200 to some of the internal connection terminals 800. The die 100 is itself directly connected to the other internal connection terminals 800 through its upper face.

For example, the hybrid die 100 may have a surface area between 24 and 50 mm² (square millimeters), measured parallel to the dice themselves, and the digital die 200 may have a surface area between 16 and 40 mm².

The dice 100 and 200 are of the MOS or CMOS type. The hybrid die 100 may be produced using a technology with a lithographic linewidth of 65 nm, and the digital die 200 may be produced using a different technology with a smaller lithographic linewidth, such as 28 nm. The digital die 200 preferably comprises only one transistor gate oxide layer. Its structure is thus simpler and therefore less costly. The use of such a single gate oxide layer structure is made possible by the present invention, because all electrical signals that are transmitted by the interface of the intermediate connection elements 600 have a lower maximum electrical voltage. Indeed, these signals are not transmitted directly to the external connection terminals 500 of the circuit assembly.

Preferably, and more particularly when the digital die 200 has a smaller lithographic linewidth than the hybrid die 100, the die 200 may have an operating frequency that is higher than that of the hybrid die 100. For example, the digital die 200 may operate at 600 MHz (megahertz) while the hybrid die 100 may operate at only 38 or 100 MHz.

The DIGIC die 200 is dedicated to performing digital functions. To do so, priority is placed on incorporating all digital modules of the circuit assembly into the die 200. The die 200 thus particularly groups together the combinatorial logical operators, sequential logical operators, and ROM or SRAM memories.

Figure 2:
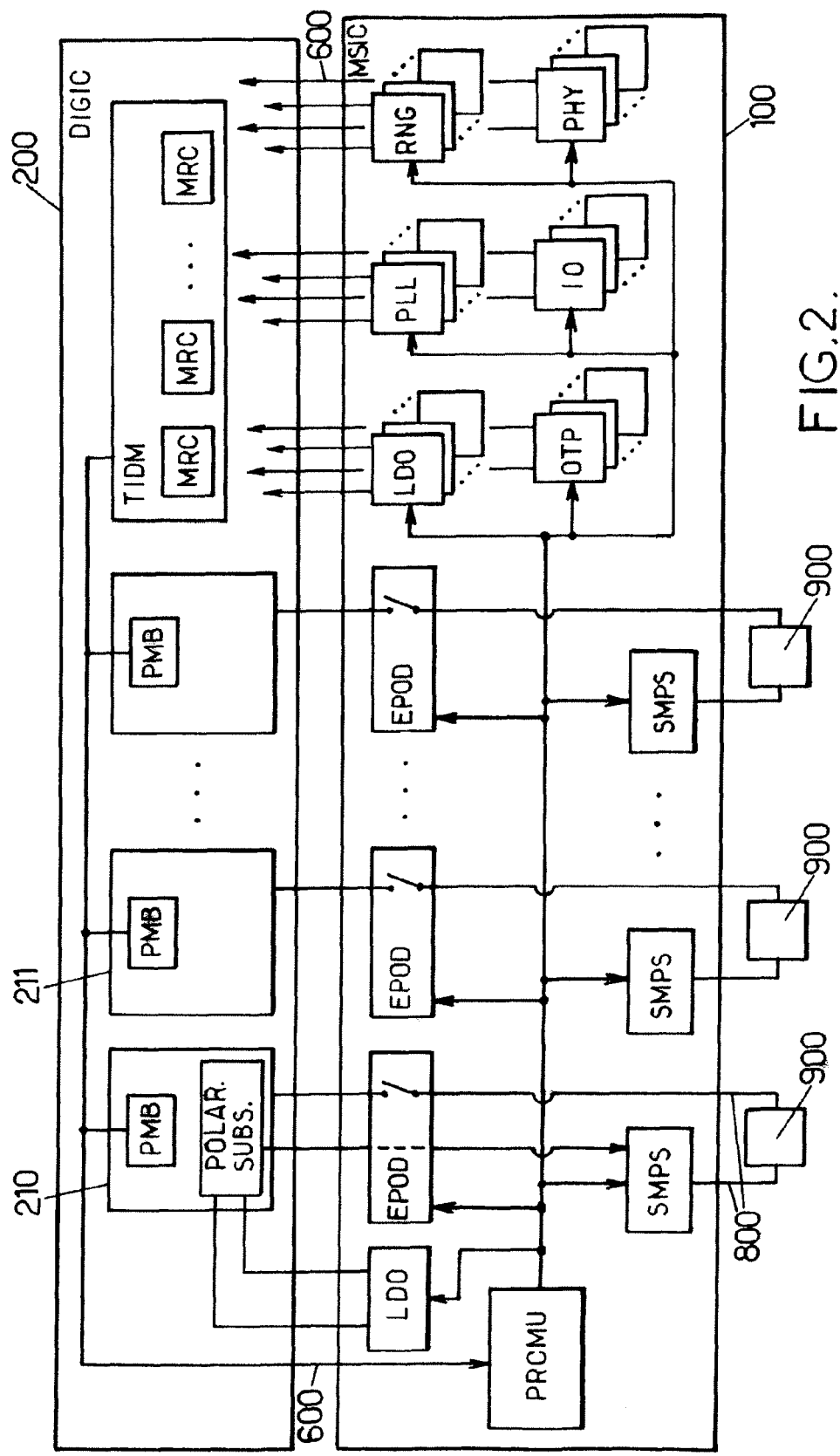
FIGS. 2 and 3 are block diagrams of electronic circuit assemblies according to two embodiments of the invention.
Figure 3:
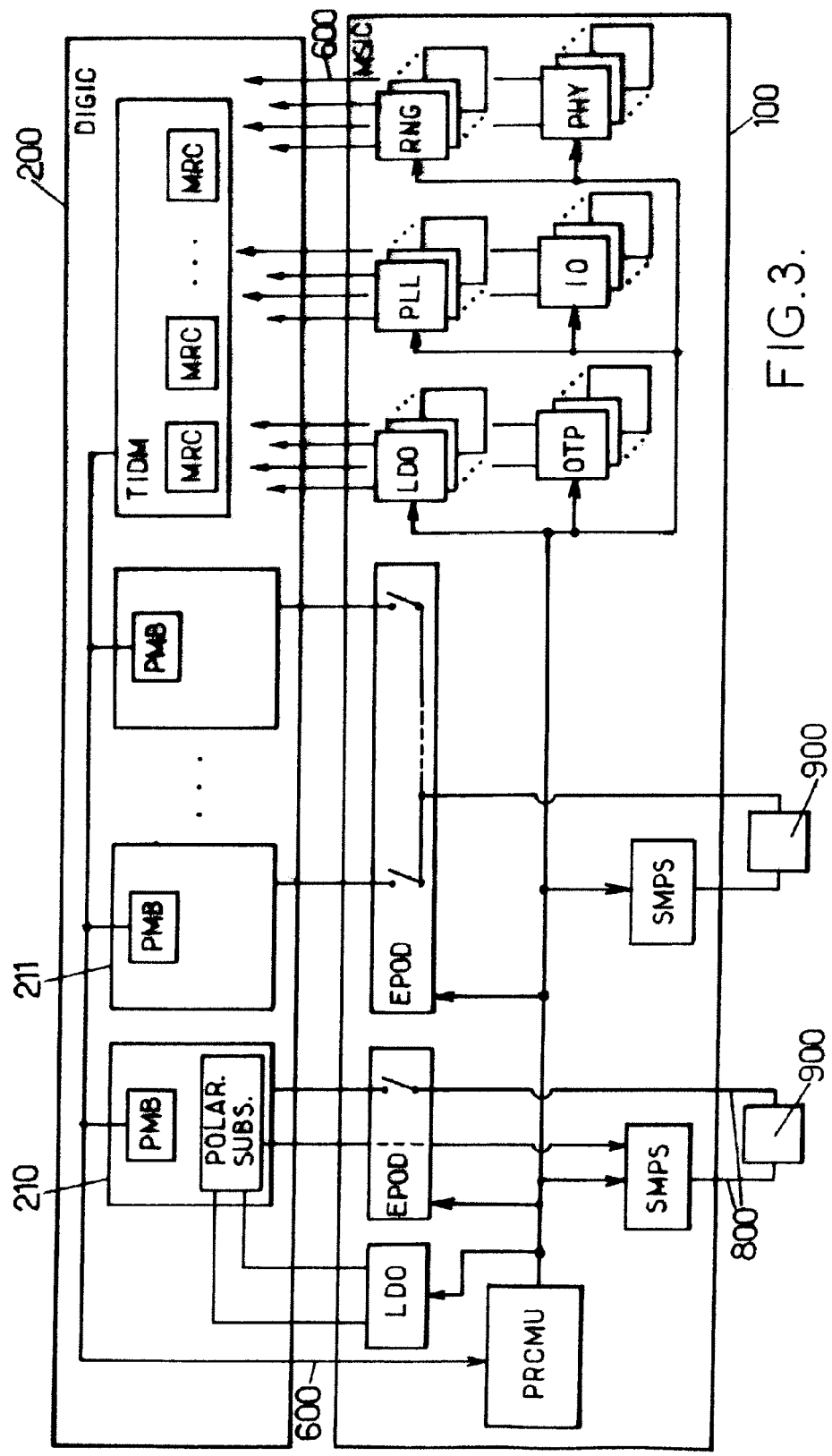

The hybrid MSIC die 100 groups together all the other circuit modules. As shown in FIGS. 2 and 3, it contains in particular circuit modules with analog functions and with hybrid digital/analog functions, including the SMPS, LDO, EPOD, OTP, PLL, ADC, DAC, IO, PHY, and RNG modules already presented in the general part of the description. In particular, the PHY modules may relate to serial interfaces, USB (Universal Serial Bus) interfaces, HDMI (High Definition Multimedia Interface) interfaces, DDR (Double Data Rate) memory interfaces, etc. The design of such analog or hybrid digital/analog modules would be longer and more complex if they had to be produced using a smaller lithographic linewidth technology like that of the DIGIC die 200. Indeed, such analog or hybrid modules have to be adapted when they are produced with a smaller lithographic linewidth, particularly in order to operate with identical voltage levels and/or to avoid increasing the amount of leakage currents. Furthermore, for a given circuit module, an increase in the integration level amplifies the signal bounce that occurs in certain module nodes. Such signal bounce makes it necessary to provide larger or more bypass capacitors in order to absorb them. Yet bypass capacitors are themselves costly and require an increase in the surface area of the silicon substrate used.

In addition, modules to protect against electrostatic discharge, designated ESD, are combined with the intermediate connection elements 600 between the two dice 100 and 200. Each connection element 600 is associated with one ESD module contained in the hybrid die 100 and another ESD module contained in the digital die 200. Each ESD module of the die 200 is preferably smaller than one of the ESD modules of the die 100.

Additional ESD modules may also be associated with the I/O modules contained in the hybrid die 100. Each one of these additional ESD modules may then occupy a larger surface area than that of each one of the ESD modules of the die 100 which are associated with the intermediate connection elements 600 between the two circuit dice.

We will now describe an electrical power supply system used in the present invention to supply the electrical power necessary to operate the circuit assembly.

The modules of the digital die 200 may be distributed within domains 210, 211, etc., which are separate within the die. Each domain 210, 211, etc. has a supply voltage and operating frequency that may be controlled independently from the supply voltages and operating frequencies of the other domains. For this purpose, the digital die 200 comprises at least one PMB module that produces a signal representative of the supply voltage actually available at the transistor terminals of the voltage domain to which that PMB module belongs. A different PMB module is preferably provided in each domain 210, 21, etc. so as to supply a signal indicating a deviation between the respective actual and target supply voltages for that domain. According to one particularly advantageous embodiment, at least some of the PMB modules contained in the die 200 may each comprise a VCO or Voltage Controlled Oscillator. That VCO is connected so as to receive as input at least one voltage representative of the positive power supply and ground voltages that exist at the transistor terminals of one of the digital modules. The PMB module is then adapted to produce signals representative of those supply voltages in the form of sequences of digital values, which are themselves representative of the frequency value of the VCO. These signals in the form of sequences of digital values are then transmitted to the hybrid die 100 by certain intermediate connection elements 600.

Figure 4:
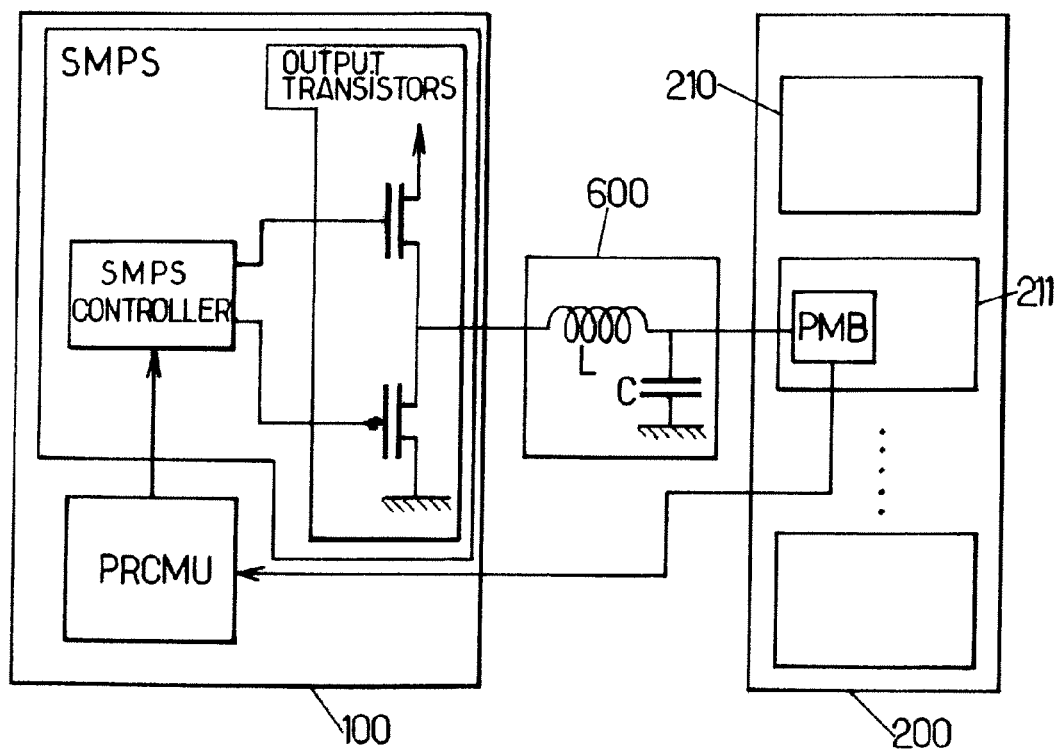
FIG. 4 is a diagram illustrating an electrical power supply principle in an electronic circuit assembly according to the invention.

The hybrid die 100 comprises a power, reset, and clock management unit designated PRCMU, which receives the signals produced by the PMB modules. The PRCMU unit compares the actual supply voltage value encoded in each signal with a target value for that supply voltage. It then produces an output control signal to adjust the electrical power that is supplied to the corresponding domain of the digital die 200. That signal is transmitted to the electrical power supply module that outputs the power consumed in the corresponding domain of the die 200. That supply module is generally one of the SMPS or LDO types known to persons skilled in the art. In accordance with the distribution of the modules between the two dice based on their natures, the electrical power supply modules that supply the power consumed in the digital die 200 are located in the hybrid die 100. They thus each transmit the electrical power to the intended domain of the die 200 through certain intermediate connection elements 600. For that purpose, the hybrid die 100 may also contain at least one EPOD switch module that connects the power supply module to the corresponding domain of the die 200 via the intermediate connection elements 600 that supply that domain. The EPOD module may also isolate the power supply module from the domain of the die 200, particularly when operation of the modules of that domain must be interrupted when the circuit assembly is in idle state. For that purpose, the EPOD module is also controlled by the PRCMU unit. In other words, at least one of the digital modules contained in the die 200 is connected to one of the electrical power supply modules contained in the die 100 by means of one of the EPOD modules. This latter is adjusted to electrically connect or isolate the digital module from the electrical power supply module based on the control signals produced by the PRCMU unit. FIG. 4 represents such an electrical power supply architecture for the domain 211 of the digital die 200. In that figure, the switching mode power supply module SMPS is depicted, highlighting an output transistor stage labeled OUTPUT TRANSISTORS and an output transistor control stage labeled SMPS CONTROLLER. Such an architecture, which is suited to varying the output voltage by modulating a duty cycle of the output transistors, is assumed to be known. The depicted capacitor C and inductor L constitute an electrical diagram equivalent to the intermediate connection elements 600 that are used in supplying power to the die 200.

FIG. 3 corresponds to FIG. 2, using an SMPS module that is common to several domains or several modules of the die 200. Thus the output from the PRCMU unit is connected to at least one SMPS power supply module, and output from the latter is itself connected to several different digital modules of the die 200 by means of an EPOD module with multiple outputs. Furthermore, in FIGS. 2 and 3, the references 900 designate external components of the die 100 and 200 that are electrically arranged between the output of each SMPS module and the input of the EPOD module connected to it. These external components 900 are similar to those of the intermediate connection elements 600. They are composed of a capacitor and an inductor, whose values are suited to the power provided by the SPMS module.

According to the operating principle of the circuit assembly proposed by the invention, the PRCMU is intended to remain active when the circuit assembly is in idle state. For that purpose, it is continuously supplied with power by an external electrical energy source, such as a battery. When in idle state, the operation of certain domains 210, 211, etc. of the digital die 200 may be interrupted. Their supply of electrical power is then also interrupted by the opening of the switches of the corresponding EPOD modules, which is controlled by the PRCMU unit. Thus, any leakage current that would be produced in the digital die 200 when in idle state is avoided, which reduces the total electrical power consumption of the circuit assembly.

The PRCMU unit is preferably located in the hybrid die 100 in order to facilitate transporting of the control signals produced by that unit to SMPS and/or LDO power supply modules and EPOD modules in particular. Locating the PRCMU unit in the hybrid MSIC die is also advantageous for reducing leakage currents from that unit, since the PRCMU unit is always active.

In a first refinement of the invention, the PRCMU unit may be programmable using firmware contained in the electronic circuit assembly. It is then a CPU (Computer Processing Unit) microprocessor in and of itself. In this manner, the operation of the PRCMU unit may be programmed based on the application of the circuit assembly. For example, it may periodically activate certain functions of the circuit while in idle state, such as monitoring the reception of external signals.

In a second refinement of the invention, one of the supply modules contained in the hybrid die 100 may be connected to a part of the substrate of the digital die 200. In that way, electrical biasing may be established in that part of the substrate of the die 200. Thus a die 200 that is slow may be accelerated by direct biasing of a substrate, and a die 200 that is fast may be slowed down by reverse biasing in order to reduce leakage currents. Such biasing may also be advantageously controlled by the PRCMU unit. For that purpose, the PRCMU unit is connected to the power supply module that produces the bias, in order to transmit an appropriate control signal to the latter. As an illustration in FIGS. 2 and 3, the part of the substrate labeled BIAS SUBST. of the domain 210 is connected to an LDO power supply module of the die 100. In this manner, a statistical dispersion present between different produced circuit assembly units, due to manufacturing variations, may be partially compensated. In addition, in this manner it is also possible to improve the performance of each produced circuit assembly unit and to reduce its electrical power consumption.

A third refinement of the invention will now be described, for providing identification of the digital die. In fact, quality standards require that each circuit die be uniquely identified in order to find the manufacturing data such as date of fabrication, lot number, silicon wafer number, position of die on the silicon wafer, fabrication site, etc. Usually, such identification is accomplished by permanently recording the data in an OPT memory contained in the die. Yet such recording is not possible in the digital die 200 as proposed by the invention, since the die 200 contains no memory element appropriate for this purpose.

In the third refinement of the invention, the digital die may also comprise an identification module, designated the TIDM for Trace IDentification Module, which is dedicated to identifying the digital die. This TIDM module itself comprises several basic identification cells, for example 32 cells, each incorporating two matched transistors having a minimal size for the lithographic linewidth of the digital die. Each basic identification cell also incorporates a measurement circuit arranged so as to produce a binary value representative of a fabrication mismatch between the matched transistors of that cell. On FIGS. 2 and 3, the basic identification cells are designated MRC for Mismatch Read Cell.

The binary value that is representative of the fabrication mismatch between the two matched transistors of each MRC cell of the TIDM module may be transmitted from the digital die 200 to the hybrid die 100. It may be stored in a write-once memory unit, or OTP, that is contained in the die 100. The die 100 may then be adapted to transmit, via an output interface of the circuit assembly, the binary value associated with each MRC cell of the TIDM module. As an alternative, the binary value that is associated with each MRC cell may be re-read in the MRC cell after another query is sent to the circuit assembly.

Figure 5:
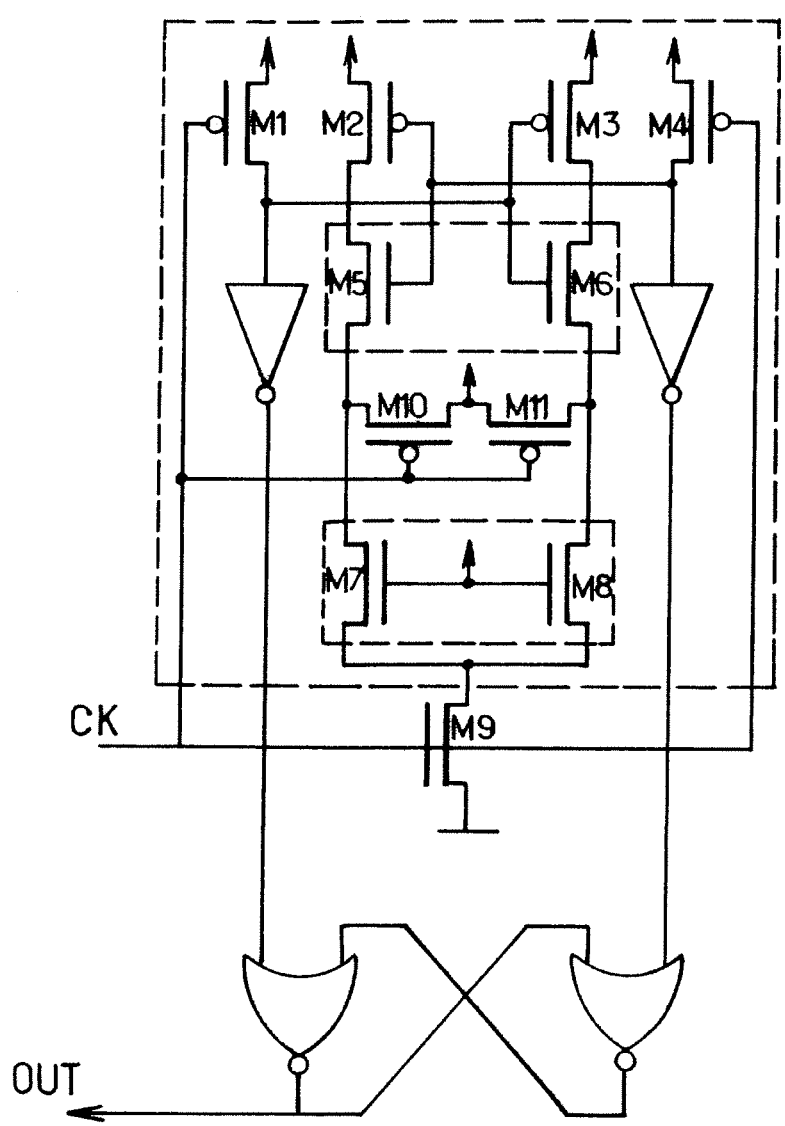
FIG. 5 is an electrical diagram of a basic identification cell that may be used in an electronic circuit assembly according to the invention.

In a particular embodiment proposed by the invention, for at least one of the MRC cells, the two matched transistors of that cell are integrated into a lock-in voltage amplifier circuit within the digital die. FIG. 5 is an electrical diagram of such an MRC cell. The operation of a lock-in voltage amplifier circuit is assumed to be known. The transistors of the cell are numbered M1 to M11; CK designates a line for distributing rising edge clock signals, and OUT indicates the output from the reading results in the form of a bit. The two transistors M7 and M8 are produced with identical gate widths and lengths that are minimal in accordance with the lithographic linewidth of the die 200. The fabrication mismatch between the two transistors M7 and M8 concerns at least one of the physical fabrication parameters, such as doping density, impurity content, etching errors, etc. Conversely, the transistors M5 and M6 are large enough in comparison to the lithographic linewidth to reduce the influence of any unintentional parametric variations that may result from their fabrication. The location of the various components of the MRC cell on the substrate of the die 200 is also selected so as to reduce systematic parametric variations that may mask the mismatch between the transistors M7 and M8 on which identification of the die is based.

The digital die is then arranged to deliver the binary values representative of fabrication mismatches of transistors M7 and M8 of the MRC cells, preferably in the form of a digital sequence constructed from those binary values. For example, a 32-bit encoded value may be constructed from the one-bit encoded values individually read in the MRC cells.

The digital die may possibly also be arranged so that the digital sequence corresponds to a combination of results obtained successively from repeated readings of the fabrication mismatches. In this way, it is possible to obtain a final reading result from the TIDM module that is reproducible and constant, even if the fabrication mismatch between transistors M7 and M8 of one of the MRC cells is very small and therefore causes variations in the results of each read operation. In that case, it is also possible to assign to the binary value that is read for each MRC cell a complementary value that characterizes the stability of the binary value obtained during the successive read operations.

It is understood that the invention may be adapted relative to the embodiments detailed above while still retaining at least some of the above-mentioned advantages. Of those advantages, the following are particularly emphasized:
- the invention makes it possible to combine two fabricated circuit dies with respective lithographic linewidths that may be different;
- the two dice in the same circuit assembly may be fabricated on different production plants so as to optimize the production load of each line;
- the circuit modules are distributed between the two dice based on their natures, which makes it possible to reduce the development time necessary to achieve a given quality level and thus the time to market delay for the circuit assembly, and
- the invention proposes a circuit assembly architecture that reduces energy losses caused by leakage currents present in the digital die.

The invention claimed is:

1. A composite electronic circuit assembly comprising two integrated circuit dice of the MOS or CMOS type and an integrated circuit package, with the two circuit dice placed in parallel to one another inside the package and electrically connected to one another by intermediate connection elements, wherein
- one of the two circuit dice, so-called digital die, contains circuit modules with digital functions, in particular combinatorial and/or sequential logical operators, read-only memory, and/or static random access memory (SRAM), and
- the other circuit die, so-called hybrid die, contains all circuit modules with analog functions or hybrid digital/analog functions, including switching or linear power supply modules, switch modules, write-once memory modules, phase locked clock generation modules, analog-to-digital converters and digital-to-analog converters, electrical signal input/output modules, physical interface modules, and/or random number generator modules,
- each digital module that is contained in the digital die being connected so as to be powered by at least one of the electrical power supply modules contained in the hybrid die, based on digital signals that are representative of a difference between an actual voltage of the digital module and a target supply voltage for that digital module, produced by at least one power supply monitoring module contained in the digital die and transmitted to a power, reset, and clock management unit contained in the circuit assembly, said power, reset, and clock management unit being arranged to remain active when the electronic circuit assembly is in idle state.

2. The electronic circuit assembly according to claim 1, wherein the supply, resent, and clock management unit is contained in the hybrid die.

3. The electronic circuit assembly according to claim 1, wherein the two dice possess respective lithographic pattern linewidths, the lithographic pattern linewidth of the digital die being smaller than the lithographic pattern linewidth of the hybrid die.

4. The electronic circuit assembly according to claim 3, wherein the lithographic pattern linewidth of the hybrid die is 65 nm and the lithographic pattern linewidth of the digital die is either 45 nm, 40 nm, 32 nm, 28 nm, 22 nm, 20 nm, or 16 nm.

5. The electronic circuit assembly according to claim 1, wherein the digital die comprises a single transistor gate oxide layer.

6. The electronic circuit assembly according to claim 1, wherein the two dice possess respective operating frequencies, the operating frequency of the digital die being higher than the operating frequency of the hybrid die.

7. The electronic circuit assembly according to claim 1, wherein at least one of the digital modules contained in the digital die is connected to one of the electrical power supply modules contained in the hybrid die by means of one of the switch modules adapted to electrically connect or isolate the digital module from the electrical supply module based on the control signals that are produced by the power, reset, and clock management unit.

8. The electronic circuit assembly according to claim 7, wherein the output from the power, reset, and clock management unit is connected to at least one switching power supply module, the output from said switching power supply module itself being connected to several different digital modules of the digital die by means of at least one multiple output switch module, so that said switching power supply module is shared by said digital modules.

9. The electronic circuit assembly according to claim 1, wherein the supply, resent, and clock management unit is programmable by firmware contained in said electronic circuit assembly.

10. The electronic circuit assembly according to claim 1, wherein at least one of the power supply monitoring modules contained in the digital die comprises a voltage controlled oscillator connected so as to receive as input at least one voltage representative of positive power supply and ground voltages that exist at transistor terminals of one of the digital modules, and is adapted to produce signals representative of said voltages existing at the transistor terminals in the form of sequences of digital values representative of the frequency value of the voltage controlled oscillator.

11. The electronic circuit assembly according to claim 1, wherein one of the power supply modules contained in the hybrid die is connected to a part of a substrate of the digital die so as to bias electrically said substrate part.

12. The electronic circuit assembly according to claim 1, also comprising modules for protection against electrostatic discharge associated with the intermediate connection elements between the two circuit dice, each of said intermediate connection elements between the two circuit dice being associated with one of said modules for protection against electrostatic discharge contained in the hybrid die and another of said modules for protection against electrostatic discharge contained in the digital die.

13. The electronic circuit assembly according to claim 12, also comprising additional modules for protection against electrostatic discharge associated with the electrical signal input/output modules contained in the hybrid die, each one of said additional modules for protection against electrostatic discharge having a larger surface area than each one of the modules for protection against electrostatic discharge of the hybrid die associated with the intermediate connection elements between the two circuit dice.

14. The electronic circuit assembly according to claim 1, wherein the digital die also comprises an identification module for said digital die, said identification module itself comprising basic identification cells, each basic identification cell incorporating two matched transistors with a minimal size for a lithographic pattern linewidth of said digital die and also incorporating a measurement circuit arranged to produce a binary value representative of a fabrication mismatch between said matched transistors.

15. The electronic circuit assembly according to claim 14, arranged to transmit the binary value representative of the fabrication mismatch between the two matched transistors of each basic identification cell of the identification module, from the digital die to the hybrid die.

16. The electronic circuit assembly according to claim 15, wherein the hybrid die comprises a write-once memory unit connected so as to store the binary value representative of the fabrication mismatch between the matched transistors of each basic identification cell of the identification module.

17. The electronic circuit assembly according to claim 15, wherein the hybrid die is adapted to transmit, via an output interface of the electronic circuit assembly, the binary value representative of the fabrication mismatch between the matched transistors of each basic identification cell of the identification module.

18. The electronic circuit assembly according to claim 14, wherein the two matched transistors of at least one of the basic identification cells is integrated into a lock-in voltage amplifier circuit within the digital die.

19. The electronic circuit assembly according to claim 14, wherein the digital die is arranged to output the binary values representative of the fabrication mismatches between the matched transistors, respectively for the basic identification cells of the identification module, in the form of a digital sequence constructed from said binary values.

20. The electronic circuit assembly according to claim 19, wherein the digital die is arranged so that the digital sequence representative of the fabrication mismatch between the matched transistors of the basic identification cells of the identification module corresponds to a combination of results successively obtained from repeated reading operations of said fabrication mismatches.

* * * * *